(12) United States Patent
Kim

(10) Patent No.: US 6,693,040 B2
(45) Date of Patent: Feb. 17, 2004

(54) METHOD FOR CLEANING THE CONTACT AREA OF A METAL LINE

(75) Inventor: Dong Joon Kim, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/119,809

(22) Filed: Apr. 11, 2002

(65) Prior Publication Data

US 2003/0068895 A1 Apr. 10, 2003

(30) Foreign Application Priority Data

Oct. 9, 2001 (KR) .................................... P2001-62127

(51) Int. Cl.[7] .......................................... H01L 21/311
(52) U.S. Cl. .................... 438/700; 438/708; 438/709; 216/54; 216/63; 216/66; 216/79
(58) Field of Search ......................... 438/700, 708, 438/709; 216/59, 63, 66, 79

(56) References Cited

U.S. PATENT DOCUMENTS

| | | | | |
|---|---|---|---|---|
| 6,093,635 A | * | 7/2000 | Tran et al. | 438/623 |
| 6,107,192 A | | 8/2000 | Subrahmanyan et al. | |
| 6,124,211 A | * | 9/2000 | Butterbaugh et al. | 438/708 |
| 6,159,859 A | | 12/2000 | Robertson, III et al. | |
| 6,211,092 B1 | | 4/2001 | Tang et al. | |
| 6,319,842 B1 | | 11/2001 | Khosla et al. | |
| 6,448,657 B1 | * | 9/2002 | Dorleans | 257/774 |
| 6,538,324 B1 | * | 3/2003 | Tagami et al. | 257/751 |

* cited by examiner

Primary Examiner—David Nelms
Assistant Examiner—Reneé R. Berry
(74) Attorney, Agent, or Firm—Birch, Stewart, Kolasch & Birch, LLP

(57) ABSTRACT

A method for cleaning a contact area of a metal line wherein a nitride barrier layer is formed on a sidewall of an insulating interlayer within the contact area by introducing the nitrogen-based radical to the contact area, whereby it is possible to prevent a low dielectric insulating interlayer from becoming deteriorated by the redeposition of metal ions and by hydrogen radical activated during reactive cleaning, thereby maintaining a low dielectric characteristic of the insulating interlayer. The method includes the steps of sequentially depositing the metal line and an insulating interlayer on a substrate, forming the contact area by selectively removing the insulating interlayer, forming a nitride barrier layer on the sidewalls of the insulating interlayer by introducing the nitrogen-based radical into the contact area, removing residue from the surface of the metal line by sputtering $Ar^+$ ions into the contact area, removing a metal oxide layer formed at the exposed metal line by reactive cleaning of the contact area, and removing byproducts formed at the sidewall of the insulating interlayer by performing a plasma surface process applying the nitrogen-based radical to the contact area.

14 Claims, 4 Drawing Sheets

METHOD FOR CLEANING THE CONTACT AREA OF A METAL LINE

This application claims the benefit of the Korean Application No. P2001-62127 filed on Nov. 13, 2001, which is hereby incorporated by reference.

BACKGROUND OF THE INVENTION

1. Field of the Invention

The present invention relates to a metal line of a semiconductor device, and more particularly, to a method for cleaning a contact area of a metal line in which a nitride barrier layer is formed at a sidewall of an insulating interlayer within the contact area by injecting a nitrogen-based radical into the contact area, so that it is possible to prevent a low dielectric insulating interlayer from becoming deteriorated by the redeposition of metal ions and by hydrogen radicals activated during reactive cleaning, thereby maintaining a low dielectric characteristic of the insulating interlayer.

2. Discussion of the Related Art

In general, dama cleaning has been attractive as a technology that can be applicable to a multilayered metal line technology. Dama cleaning means that a metal oxide layer formed at an exposed upper part of a metal line is removed before depositing a contact metal.

The basic mechanism of dama cleaning is an etch process utilizing a dual frequency etch (DFE). That is, the dama cleaning includes a physical method caused by the collision of activated $Ar^+$ molecules with the metal oxide layer, and a chemical method using oxidation and reduction reactions of the hydrogen $H_2$ radical and elements of the metal oxide layer within a pattern, thereby removing the metal oxide layer.

A process for removing the metal oxide layer is called as the dama cleaning in that Cu substitutes for Aluminum as a line material to obtain ultrahigh speed of a device, so that damascene structure is usually used in forming the contact area of the metal line since the related art dry etch cannot be applicable to Cu line. In the damascene structure, it is required to remove the residue of the contact area like the related art process, therefore, the process for removing the metal oxide layer is called as the dama cleaning.

A cleaning method of the contact area of a metal line according to the related art dama cleaning method will now be described with reference to the accompanying drawings.

In below embodiments, a metal line is formed of Cu.

FIG. 1A to FIG. 1E are cross sectional views illustrating manufacturing process steps of the method for cleaning the contact area of the related art metal line.

As shown in FIG. 1A, a metal line 12 is formed on a substrate 11. Next, a first nitride layer 13, an insulating interlayer 14, a cap oxide layer 15 and a second nitride layer 16 are sequentially deposited and then are selectively removed to expose the metal line 12, thereby forming a contact area.

At this time, the insulating interlayer 14 is formed of a low dielectric (low-k) insulating material, so that the parasitic capacitance of the device is decreased, thereby obtaining a high operating speed.

As time goes by, the exposed metal line 12 is in contact with the air, thereby generating an oxide layer. Since the metal oxide layer and residue 17, such as a photoresist generated after photolithography, cause a deterioration of the contact characteristics between metals, the metal oxide layer and the residue, such as the photoresist are removed during cleaning. Especially in the case when the contact structure is of the damascene type, dama cleaning is used.

As described above, the dama cleaning method includes a sputtering process using $Ar^+$ and a reactive cleaning process using a hydrogen $H^*$ radical.

As shown in FIG. 1B, the exposed residue 17 (metal oxide layer and the residue such as the photoresist) is etched by sputtering Ar.

The $Ar^+$ sputtering etch is a physical method in which $Ar^+$ molecules are sputtered against the surfaces of the residue 17 to remove the residue, thereby exposing the metal line 12.

Referring to FIG. 1C, even though it is possible to remove the residue 17, e.g., the metal oxide layer by the $Ar^+$ sputtering etch, an over etch is generated to remove the metal oxide layer, whereby a metal of the etched region is redeposited at a sidewalls of the insulating interlayer.

That is, the contact area lateral diffusion of the metal is generated, thereby causing a deterioration in the characteristics of the insulating interlayer in maintaining the low dielectric characteristic.

As shown in FIG. 1D, after applying the $Ar^+$ sputtering etch, a reactive cleaning is performed by directing a hydrogen $H^*$ radical to the remaining portion of the metal oxide layer.

For example, if the hydrogen radical $H^*$ and the metal line of the metal oxide layer are formed of Cu, a chemical reaction of the following formulae is expected $[Cu_2O+2H^*->2Cu+H_2O]$ or $[Cu_2O+H^*->2Cu+OH^*]$.

Accordingly, the metal oxide layer is reduced to the metal by reactive cleaning. Also, $OH^*$ and $H_2O$ of a radical state are generated and absorbed into the insulating interlayer.

That is, the reactive byproducts, such as $OH^*$ and $H_2O$ are generated during the reactive cleaning, thereby causing a deterioration in the low dielectric characteristics of the insulating interlayer.

As shown in FIG. 1E, the metal oxide layer is mostly removed after the reactive cleaning using the hydrogen $H^*$ radical. At this time, Cu ions redeposited at the sidewall of the insulating interlayer and the reactive byproducts such as $H_2O$ and $OH^*$ radical are not perfectly removed.

The residue at the sidewall of the insulating interlayer is absorbed into the insulating interlayer, thereby deteriorating the low dielectric characteristic of the insulating interlayer.

The related art cleaning method of the contact area of the metal line has the following problems.

In general, the dama cleaning includes the physical method sputtering $Ar^+$ molecules activated to the metal oxide layer, and the chemical method reducing the metal oxide layer to the metal by the hydrogen $H^*$ radical.

However, in case using $Ar^+$ molecules, the over etch may be generated, so that the metal is redeposited at the sidewall of the insulating interlayer within the contact area. In case using hydrogen radical, the reactive byproducts remain at the sidewall, and then are soaked and absorbed.

Also, the byproducts remaining at the sidewall of the insulating interlayer generates deterioration of adhesion between the contact metal of the contact area and the insulating interlayer.

As a result, the low dielectric characteristic of the insulating interlayer is lost, so that it is impossible to maintain insulating characteristic except the contact area, thereby deteriorating characteristic of the semiconductor device.

SUMMARY OF THE INVENTION

Accordingly, the present invention is directed to a method for cleaning a contact area of a metal line that substantially obviates one or more problems due to limitations and disadvantages of the related art.

An object of the present invention is to provide a method for cleaning a contact area of a metal line in which a nitride barrier layer is formed at a sidewall of an insulating interlayer within the contact area by injecting nitrogen-based radical into the contact area, so that it is possible to prevent a low dielectric insulating interlayer from being deteriorated by redeposition of metal ions and by hydrogen radical activated during reactive cleaning, thereby maintaining a low dielectric characteristic of the insulating interlayer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for cleaning of a contact area of a metal line includes the steps of sequentially depositing the metal line and an insulating interlayer on a substrate, forming the contact area by selectively removing the insulating interlayer, forming a nitride barrier layer at a sidewall of the insulating interlayer by injecting nitrogen-based radical into the contact area, removing a residue on a surface of the metal line by sputtering $Ar^+$ ions into the contact area, removing a metal oxide layer formed at the exposed metal line by reactive cleaning of the contact area, and removing byproducts formed at the sidewall of the insulating interlayer by performing a plasma surface process using the nitrogen-based radical to the contact area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the present description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like elements.

A method for cleaning a contact area of a metal line will be described with reference to the accompanying drawings.

In below embodiments of the present invention, the metal line is formed of Cu.

FIG. 2A to FIG. 2F are cross sectional views illustrating a method for cleaning a contact area of a metal line according to the present invention.

Figure 1A:
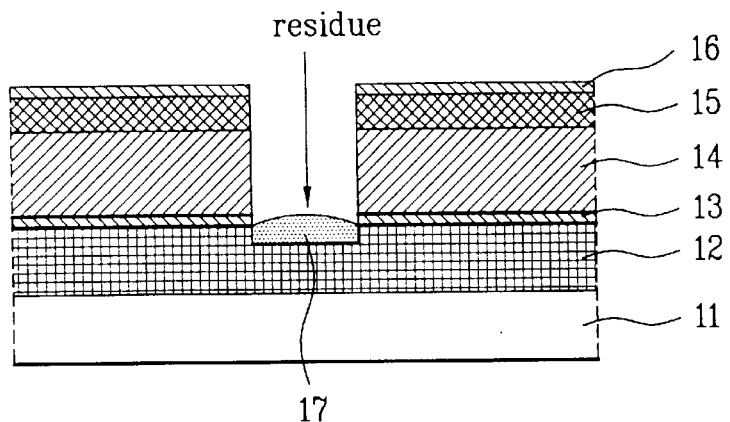
FIG. 1A to FIG. 1E are cross sectional views illustrating a related art method for cleaning a contact area of a metal line.
Figure 1B:
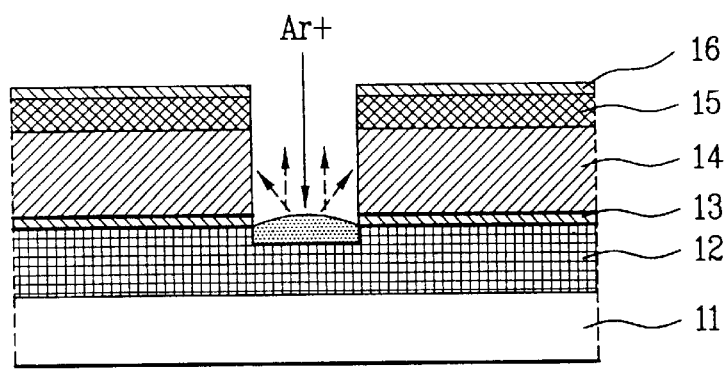
Figure 1C:
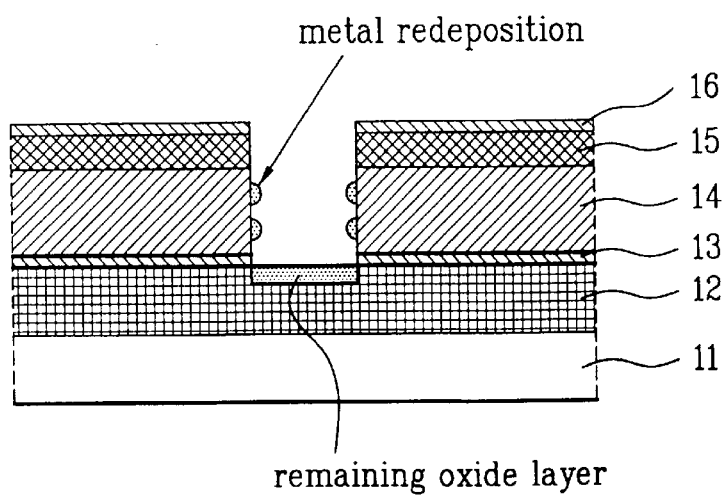
Figure 1D:
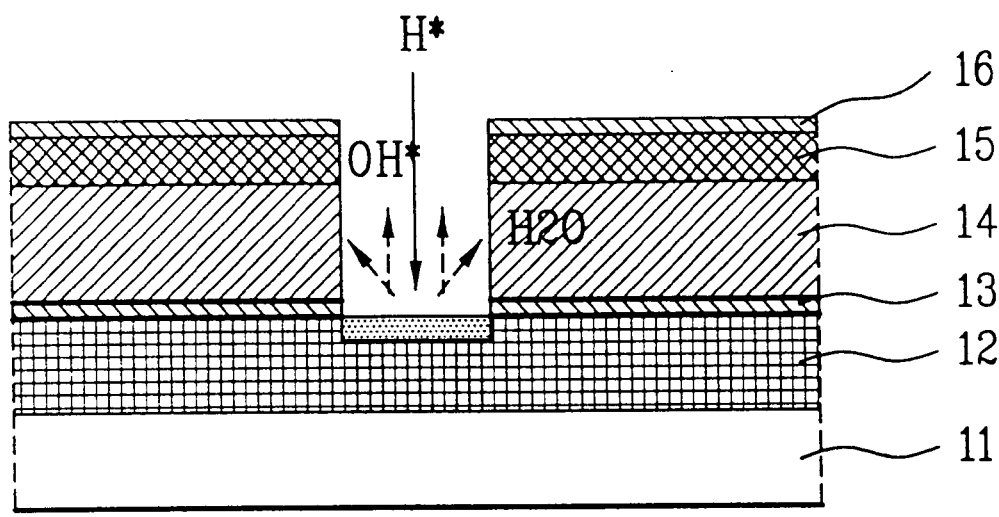
Figure 1E:
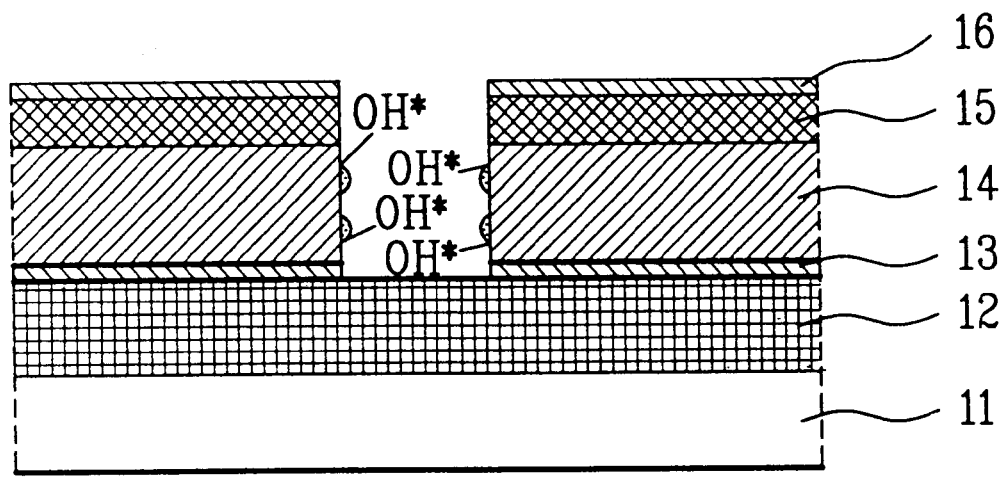
Figure 2A:
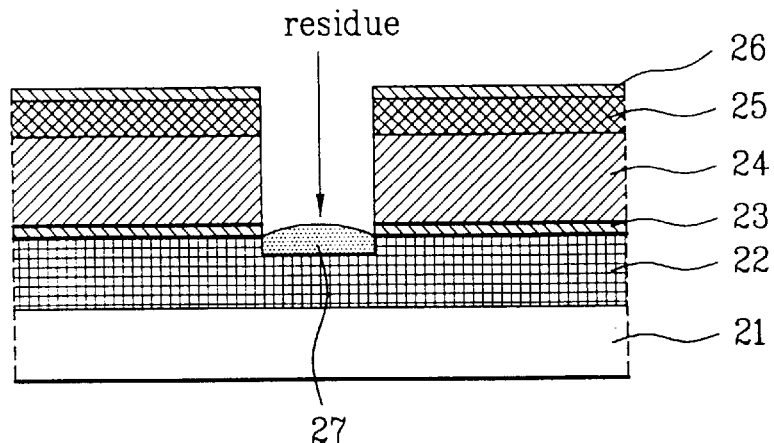
FIG. 2A to FIG. 2F are cross sectional views illustrating a method for cleaning a contact area of a metal line according to the present invention.

As shown in FIG. 2A, a metal line 22 is formed on a substrate 21. Next, a first nitride layer 23, an insulating interlayer 24, a cap oxide layer 25 and a second nitride layer 26 are sequentially deposited, and then are selectively removed to expose the metal line 22, thereby forming a contact area.

At this time, the insulating interlayer 24 is formed of a low dielectric (low-k) insulating material, thereby improving insulation effectiveness.

As time goes by, the exposed metal line 22 is exposed to the air, thereby forming an oxide layer, residue 27. Since the residue 27 can cause a deterioration in the characteristics of the contact area, the residue 27 has to be removed.

Figure 2B:
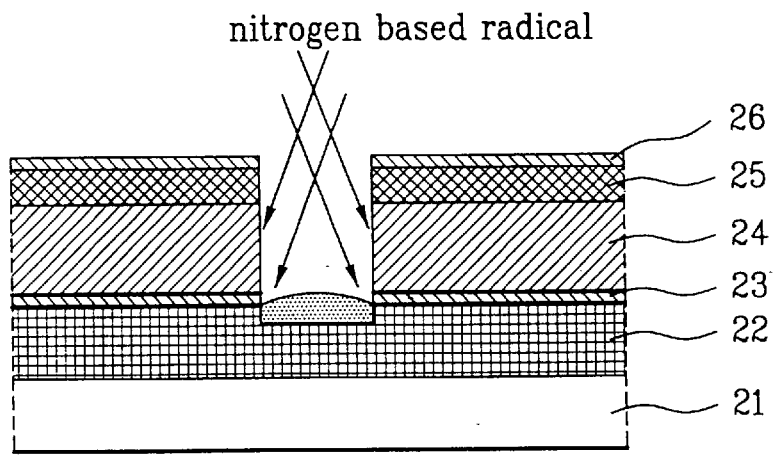

Referring to FIG. 2B, according to the present invention, $NH_3$ or $N_2$ gas is excited by plasma, forming a nitrogen-based radical. Then, the nitrogen-based radical is soaked on the contact area, whereby a nitride barrier 28 is formed at sidewalls of the second nitride layer 26, the insulating interlayer 25, the cap oxide layer 24 and the first nitride layer 23. At this time, the nitride barrier 28 serves as a barrier for reactive byproducts generated during the dama cleaning.

Even though the nitride barrier 28 is formed by chemical vapor deposition (CVD), the nitride barrier 28 can be equally served as the barrier.

As described in the embodiments of the present invention, a nitrogen-based radical is used, which is formed by exciting reactive $NH_3$ or $N_2$ gas with plasma. $NH_3$ gas is preferable to $N_2$ gas since $NH_3$ is more reactive than $N_2$.

The nitride barrier 28 is an element of $SiO_xN_y$, which is formed by soaking the nitrogen-based radical with plasma at a temperature of 400° C. or below, e.g., room temperature to 400° C. without applying bias voltage for ten minutes or less.

The following cleaning process is a dual frequency etch using an $Ar^+$ radical and a hydrogen $H^*$ radical.

Figure 2C:
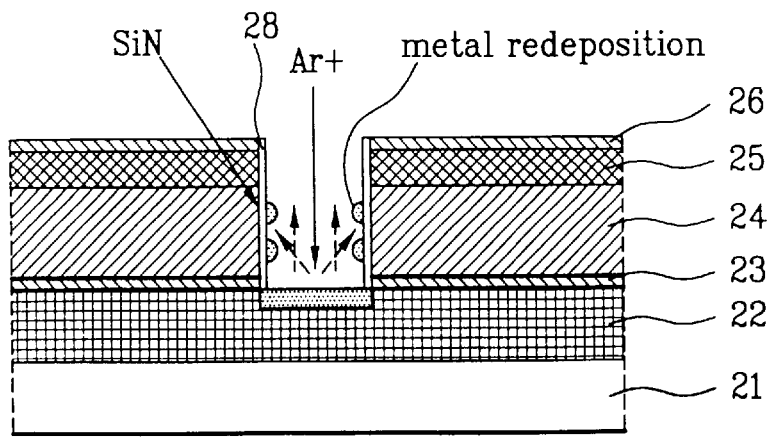

As shown in FIG. 2C, the residue 27 formed on the exposed metal line 22 (metal oxide layer and photoresist) is etched by sputtering $Ar^+$.

At this time, even though the metal is redeposited, it is possible to prevent the insulating interlayer from becoming deteriorated by the nitride barrier layer 28 formed at the sidewall of the insulating interlayer 24 within the contact area.

Figure 2D:
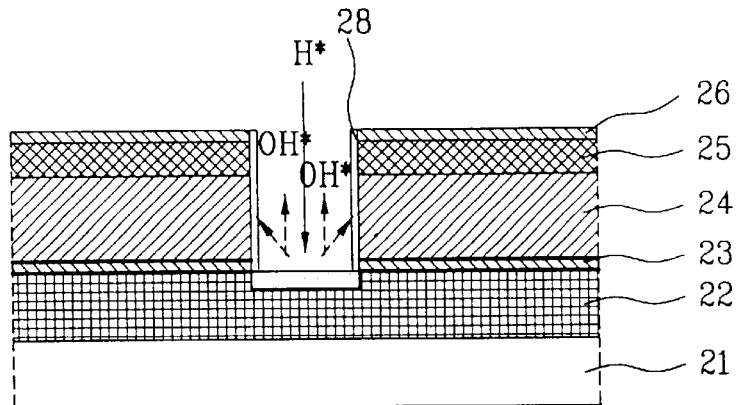

As shown in FIG. 2D, reactive cleaning using a hydrogen radical $H^*$ is performed to remove the remaining residue (metal oxide layer) 27. After sputtering with $Ar^+$, the metal oxide layer is reduced to the metal by the oxidation and reduction reactions of the hydrogen radical with the metal oxide layer formed on the exposed metal line 22, thereby generating byproducts such as $H_2O$ or $OH^*$.

At this time, the reactive byproducts such as $H_2O$ or $OH^*$ are not soaked into the insulating interlayer 24 due to the nitride barrier layer 28 present on the sidewalls of the contact area, but rather the byproducts are soaked or absorbed on the nitride barrier layer 28 disposed on the sidewalls. Accordingly, the insulating interlayer 24 can maintain low dielectric characteristics.

Figure 2E:
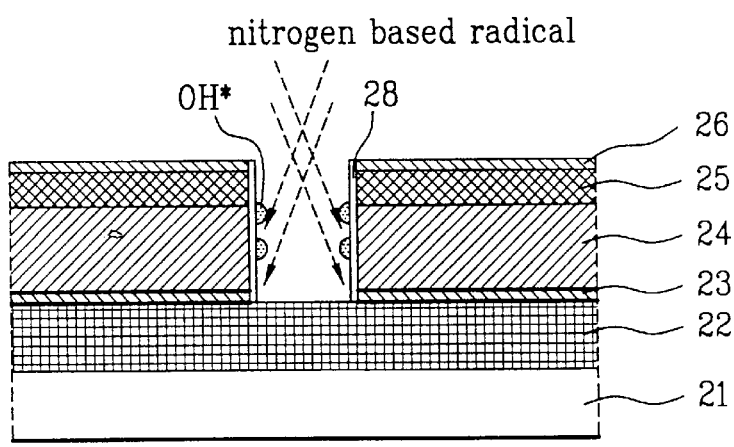

As shown in FIG. 2E, plasma surface processing using $NH_3$ or $N_2$ radicals excited by plasma, is performed on the surface of the nitride barrier layer 28 to remove $H_2O$ or $OH^*$ soaked or absorbed by the nitride barrier layer 28 due to the reactive cleaning.

At this time, the plasma surface process is performed at a temperature of 400° C. or below, at a surface processing time of between 1 minute and 10 minutes, at a gas flux of between 1 sccm and 20 sccm, and at a power of between 100W and 800W. The plasma surface process is performed at a table power of 500W or below and at a DC bias voltage of 50V or below.

Figure 2F:
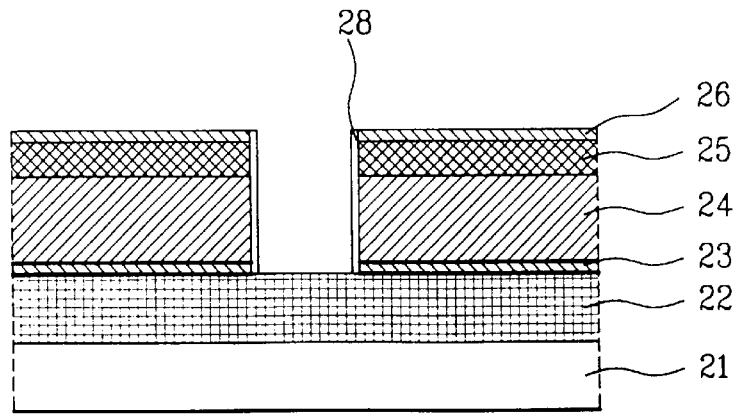

The contact area finally formed is shown in FIG. 2F. The exposed surface of the metal line does not have any particles. Also, the reactive byproducts formed on the sidewalls of the insulating interlayer, including the nitride barrier layer, are removed, thereby improving wetability. Accordingly, it is possible to improve the adhesion between the contact metal and the insulating interlayer during a later metal deposition process.

The present invention additionally includes the process of forming the nitride sidewall by injecting the nitrogen-based radical, before the dama cleaning, and the process for performing the plasma surface process using the nitrogen-based radical, after the dama cleaning, thereby improving the characteristics of dama cleaning.

The temperature of the substrate during the forming of the nitride barrier layer by injecting the nitrogen-based radical is different from that while performing the plasma surface process using the nitrogen-based radical, thereby maintaining the low dielectric characteristics of the insulating interlayer. That is, the temperature of the substrate is maintained at 200° C. or below, e.g., room temperature to 200° C., during forming the nitride barrier layer by injecting the nitrogen-based radical, and the temperature of the substrate is maintained at 200° C. or higher while performing the plasma surface process using the nitrogen-based radical.

The nitride barrier layer $SiO_xN_y$ can serve as a diffusion barrier layer to prevent the metal from being diffused during a later annealing process even though a small quantity of metal is redeposited at the sidewall of the insulating interlayer.

Also, the nitride barrier layer of the present invention can serve as a chemical barrier layer that prevents the low dielectric characteristics of the insulating interlayer from being deteriorated by $H_2O$ or OH* radicals generated from the $H_2$ reactive cleaning, the later process of DFE.

The method of cleaning the contact area of the metal line may be included in the process of forming the dual damascene.

The method of cleaning the contact area of the metal line according to the present invention has the following advantages.

Even though it is impossible to radically solve the redeposition of Cu on the sidewalls of the insulating interlayer within the contact area generated in the related art, it is possible to form a nitride barrier layer at the sidewalls of the insulating interlayer within the contact area by using the nitrogen-based radicals of $NH_3$ or $N_2$, thereby forming the diffusion barrier layer for the metal during the later annealing process. Therefore, it is possible to prevent the insulating interlayer from becoming deteriorated during the forming of the device, thereby improving the productivity of the device.

Furthermore, the byproducts such as $H_2O$ or OH* radicals generated from the reactive cleaning using the hydrogen H* radical is soaked or absorbed by the nitride barrier layer, thereby preventing the dielectric characteristics of the insulating interlayer from becoming degraded.

Finally, the plasma surface process using a nitrogen-based radical is performed to remove the byproducts after the reactive cleaning of the hydrogen radical, thereby improving adhesion for the later metal deposition process.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A method of cleaning a contact area of a metal line comprising the steps of:
    sequentially depositing the metal line and an insulating interlayer on a substrate;
    forming the contact area by selectively removing the insulating interlayer;
    forming a nitride barrier layer on the sidewalls of the insulating interlayer by introducing a nitrogen-based radical into the contact area, said nitride barrier layer acting as a diffusion barrier to prevent said insulating interlayer from being deteriorated by redeposited metal;
    removing residue formed on a surface of the metal line by sputtering $Ar^+$ ions into the contact area;
    removing a metal oxide layer formed on the exposed metal line by reactive cleaning of the contact area; and
    removing byproducts formed at the sidewall of the insulating interlayer by performing a plasma surface process using the nitrogen-based radical on the contact area.

2. The method of claim 1, wherein the insulating interlayer is formed of multilayered insulating layers.

3. The method of claim 1, wherein the metal line is formed of Cu.

4. The method of claim 1, wherein the nitrogen-based radical is formed by exciting $NH_3$ or $N_2$ gas with plasma.

5. The method of claim 1, wherein the nitride barrier layer is formed by soaking the nitrogen-based radical with plasma at a temperature of 400° C. or less without applying a bias voltage for ten minutes or less.

6. The method of claim 1, wherein the metal oxide layer is reduced to metal by the reactive cleaning process of oxidation and reduction reactions of the hydrogen $H_2$ radical and the elements of the metal oxide layer, thereby generating reactive byproducts.

7. The method of claim 6, wherein the reactive byproducts from the reactive cleaning is soaked into the surface of the nitride barrier layer.

8. The method of claim 7, wherein the nitride barrier layer serves as a chemical barrier layer for the reactive byproducts generated from the reactive cleaning.

9. The method of claim 7, wherein the reactive byproducts are $H_2O$ or OH* radicals.

10. The method of claim 1, wherein the plasma surface process of the nitrogen-based radical is performed at a temperature of from room temperature to 400° C., at a surface processing time of between 1 minute and 10 minutes, at a gas flux of between 1 sccm and 20 sccm, and at a power of between 100W and 800W.

11. The method of claim 10, wherein the plasma surface process of the nitrogen-based radical is performed at a table power of 500W or less and a bias voltage of 50V or less.

12. The method of claim 1, wherein the a temperature of the substrate during forming the nitride barrier layer by treating with the nitrogen-based radical is different than when performing the plasma surface process using the nitrogen-based radical.

13. The method of claim 12, wherein the temperature of the substrate is maintained at from room temperature to 200° C. during the forming of the nitride barrier layer by treatment with the nitrogen-based radical, and the temperature of the substrate is maintained at 200° C. or higher while performing the plasma surface treatment using the nitrogen-based radical.

14. A method of cleaning the contact area of a metal line comprising:

sequentially depositing the metal line and an insulating interlayer on a substrate;

forming the contact area by selectively removing the insulating interlayer;

forming a nitride barrier layer on the sidewalls of the insulating interlayer by introducing an ammonia radical into the contact area;

removing residue formed on a surface of the metal line by sputtering $Ar^+$ ions into the contact area;

removing a metal oxide layer formed on the exposed metal line by hydrogen reactive cleaning within the contact area; and removing the hydrogen-based reactive byproducts formed at the sidewalls of the insulating interlayer by performing a plasma surface process using the ammonia radical or the nitrogen-based radical on the contact area.

* * * * *

UNITED STATES PATENT AND TRADEMARK OFFICE
CERTIFICATE OF CORRECTION

| | | |
|---|---|---|
| PATENT NO. | : 6,693,040 B2 | Page 1 of 1 |
| APPLICATION NO. | : 10/119809 | |
| DATED | : February 17, 2004 | |
| INVENTOR(S) | : Dong Joon Kim | |

It is certified that error appears in the above-identified patent and that said Letters Patent is hereby corrected as shown below:

Column 1, line 5, the foreign priority date which is set forth as "November 13, 2001" should read -- October 9, 2001 --. As such, the complete line should read as follows:

--Application No. P2001-62127 filed on October 9, 2001, which is--

Signed and Sealed this

Fourth Day of August, 2009

JOHN DOLL
*Acting Director of the United States Patent and Trademark Office*